United States Patent
Cheng et al.

(10) Patent No.: US 8,889,495 B2
(45) Date of Patent: Nov. 18, 2014

(54) SEMICONDUCTOR ALLOY FIN FIELD EFFECT TRANSISTOR

(71) Applicant: International Business Machines Corporation, Armonk, NY (US)

(72) Inventors: Kangguo Cheng, Schenectady, NY (US); Thomas N. Adam, Slingerlands, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/644,742

(22) Filed: Oct. 4, 2012

(65) Prior Publication Data

US 2014/0097518 A1    Apr. 10, 2014

(51) Int. Cl.
  *H01L 29/06* (2006.01)
(52) U.S. Cl.
  USPC ............ 438/149; 438/157; 438/30; 438/285; 438/424; 438/197; 438/154; 438/299; 438/192; 438/153
(58) Field of Classification Search
  CPC ............... H01L 27/1214; H01L 29/66772; H01L 29/66795; H01L 29/78317
  USPC ............ 257/618; 438/149, 157, 30, 285, 424, 438/197, 154, 299, 192, 153
  See application file for complete search history.

(56) References Cited

U.S. PATENT DOCUMENTS

| | | | |
|---|---|---|---|
| 7,101,763 B1 | 9/2006 | Anderson et al. | |
| 7,198,995 B2 | 4/2007 | Chidambarrao et al. | |
| 7,256,439 B2 * | 8/2007 | Cheng et al. | 257/301 |
| 7,642,603 B2 * | 1/2010 | Datta et al. | 257/365 |
| 7,728,324 B2 | 6/2010 | Tezuka et al. | |
| 7,736,954 B2 * | 6/2010 | Hussain et al. | 438/149 |
| 7,767,560 B2 | 8/2010 | Jin et al. | |
| 8,030,173 B2 * | 10/2011 | Turner et al. | 438/435 |
| 8,183,627 B2 | 5/2012 | Currie | |
| 2005/0156246 A1 | 7/2005 | Lochtefeld et al. | |

(Continued)

OTHER PUBLICATIONS

OK, I. et al., "Strained SiGe and Si FinFETs for High Performance Logic with SiGe/Si Stack on SOI" 2010 IEEE International Electron Devices Meeting (IEDM) (Dec. 6-8, 2010) pp. 34.2.1-34.2.4.

(Continued)

*Primary Examiner* — Telly Green
*Assistant Examiner* — Damian A Hillman
(74) *Attorney, Agent, or Firm* — Scully, Scott, Murphy & Presser, P.C.; H. Daniel Schnurmann

(57) ABSTRACT

Semiconductor alloy fin structures can be formed by recessing a semiconductor material layer including a first semiconductor material to form a trench, and epitaxially depositing a semiconductor alloy material of the first semiconductor material and a second semiconductor material within the trench. The semiconductor alloy material is epitaxially aligned to the first semiconductor material in the semiconductor material layer. First semiconductor fins including the first semiconductor material and second semiconductor fins including the semiconductor alloy material can be simultaneously formed. In one embodiment, the first and second semiconductor fins can be formed on an insulator layer, which prevents diffusion of the second semiconductor material to the first semiconductor fins. In another embodiment, shallow trench isolation structures and reverse biased wells can be employed to provide electrical insulation among neighboring semiconductor fins.

20 Claims, 15 Drawing Sheets

(56) References Cited

U.S. PATENT DOCUMENTS

2009/0035909 A1 2/2009 Chang et al.
2009/0294800 A1* 12/2009 Cheng et al. .................. 257/192
2011/0180847 A1 7/2011 Ikeda et al.

OTHER PUBLICATIONS

Franco, J. et al., "Superior NBTI Reliability of SiGe Channel pMOSFETs: Replacement Gate, FinFETs, and Impact of Body Bias" 2011 IEEE International Electron Devices Meeting (IEDM) (Dec. 5-7, 2011) pp. 18.5.1-18.5.4.

Chung, S.S. et al., "A New Observation of the Germanium Outdiffusion Effect on the Hot Carrier and NBTI Reliabilities in Sub-100nm Technology Strained-Si/SiGe CMOS Devices" 2005 Symposium on VLSI Technology Digest of Technical Papers (Jun. 14-16, 2005) pp. 86-87.

* cited by examiner

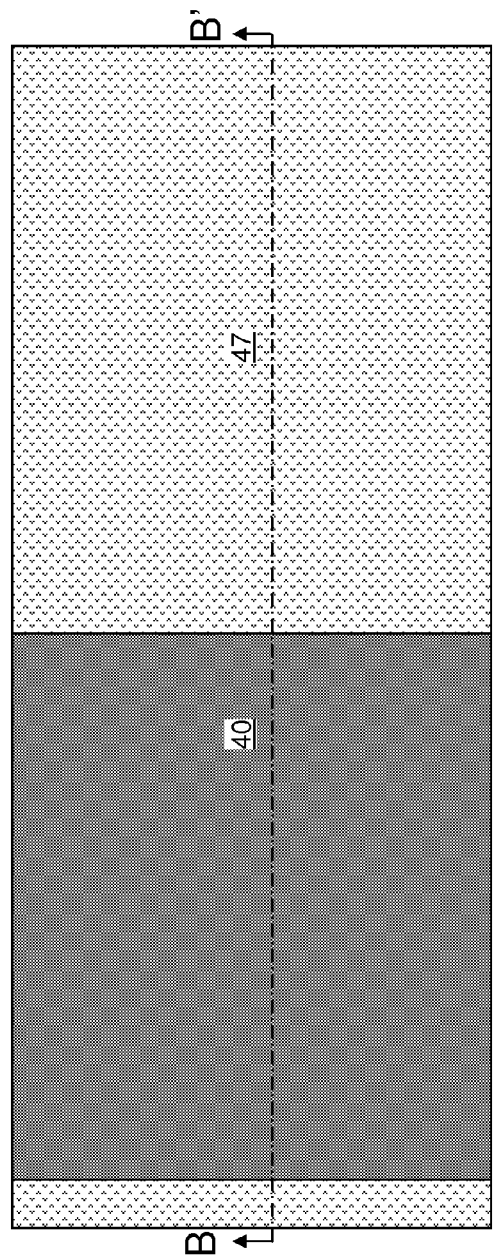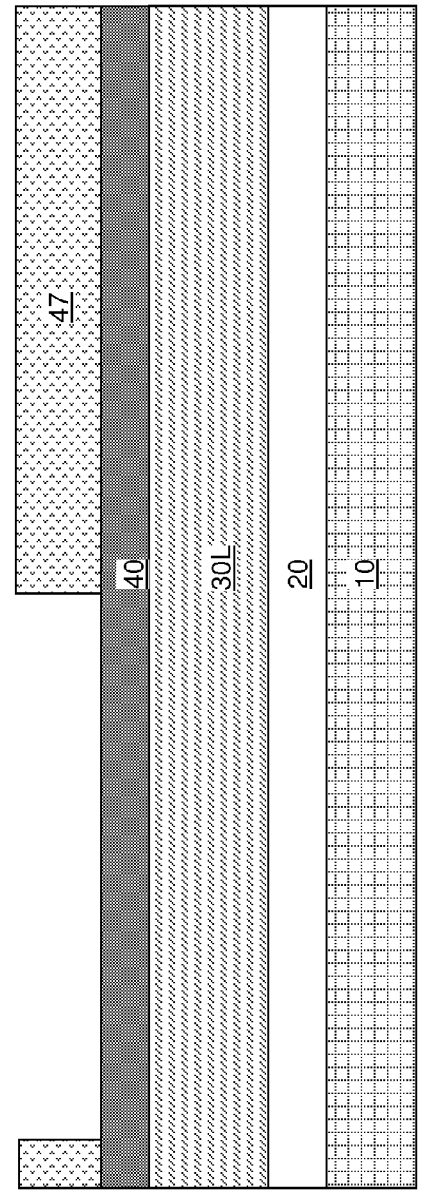

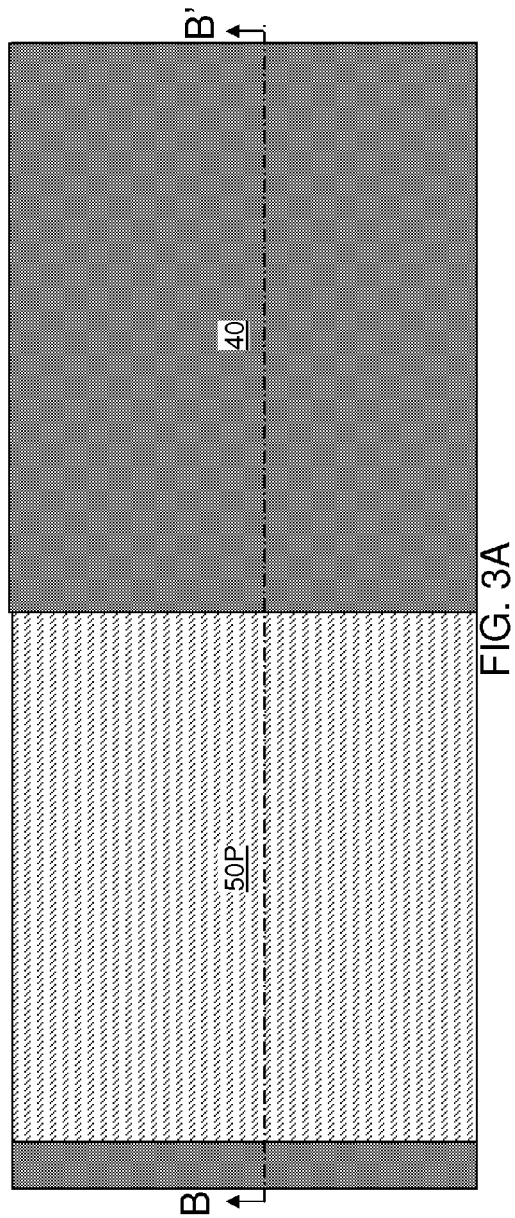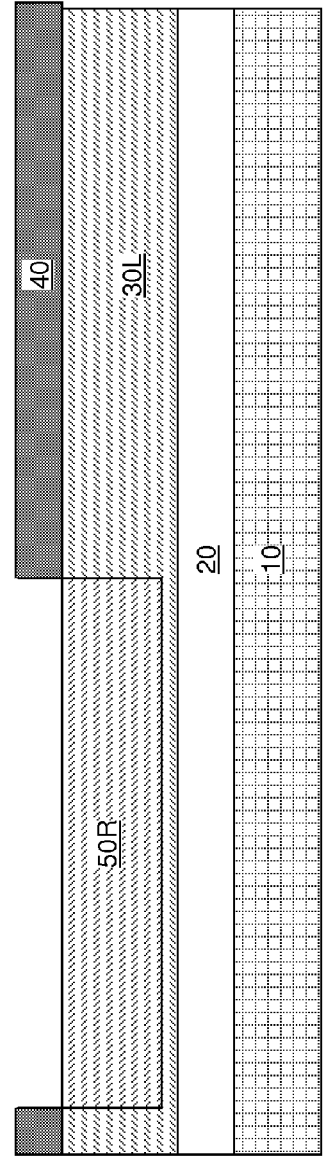
FIG. 3A
FIG. 3B

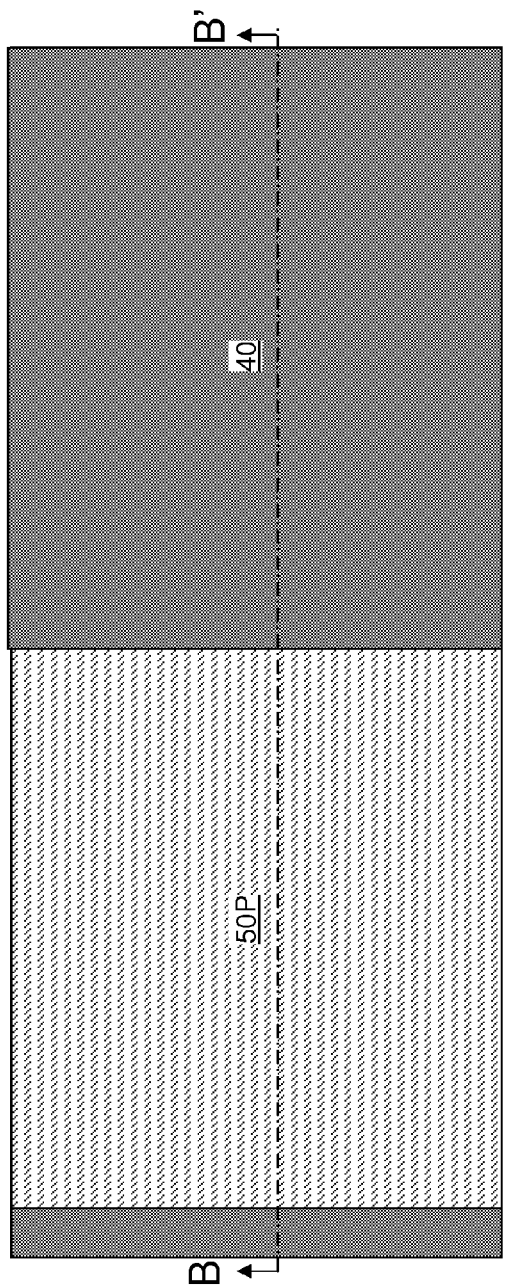
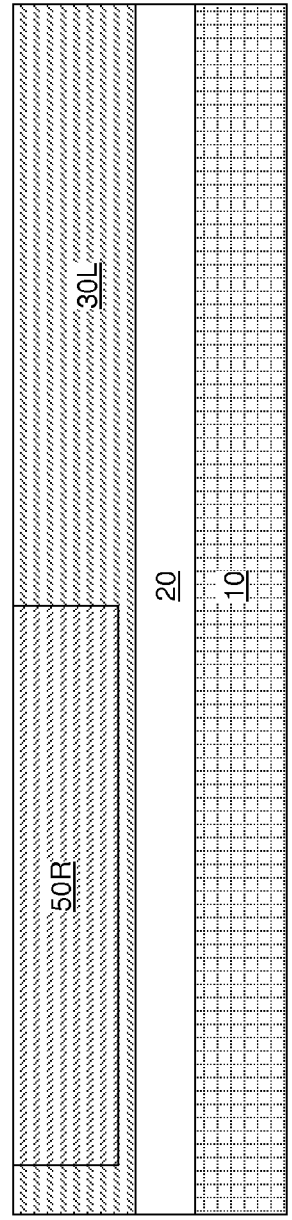
FIG. 4A
FIG. 4B

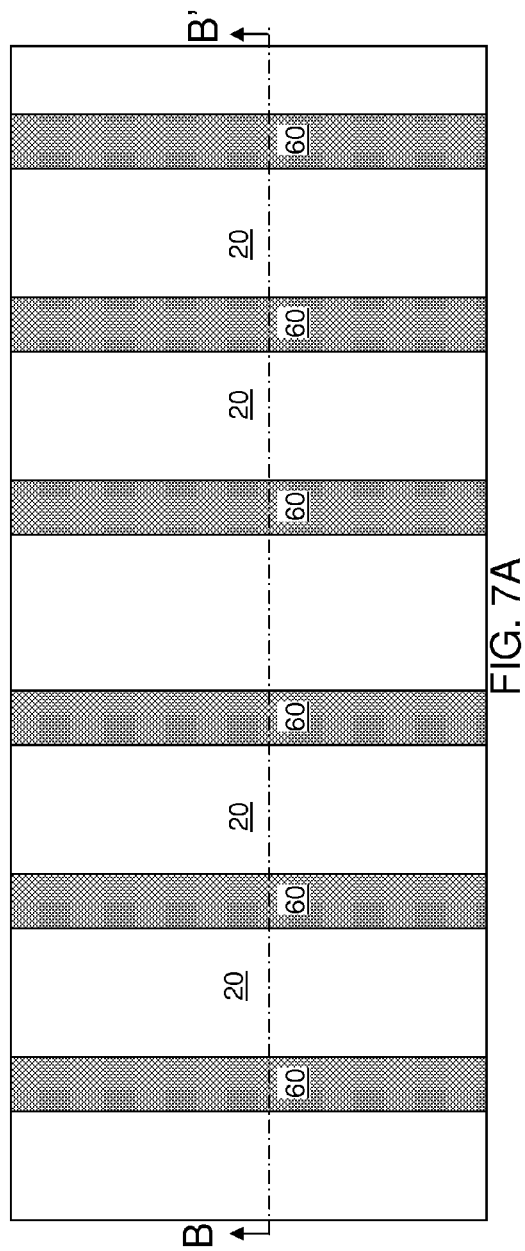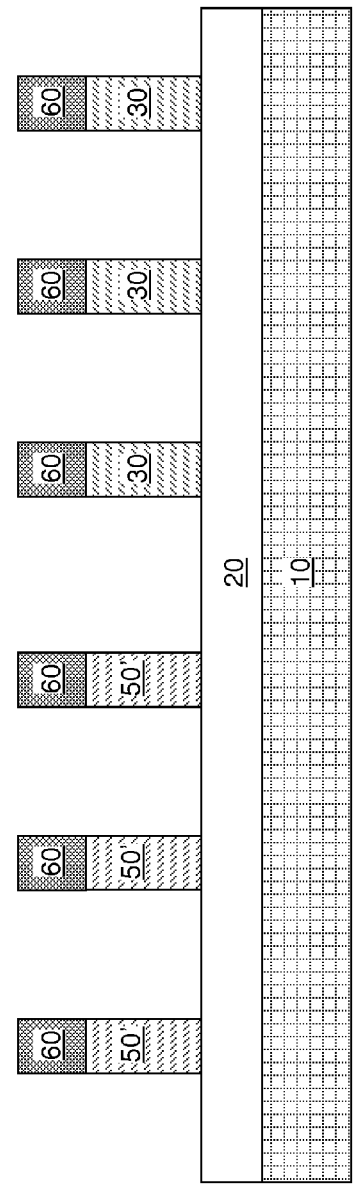

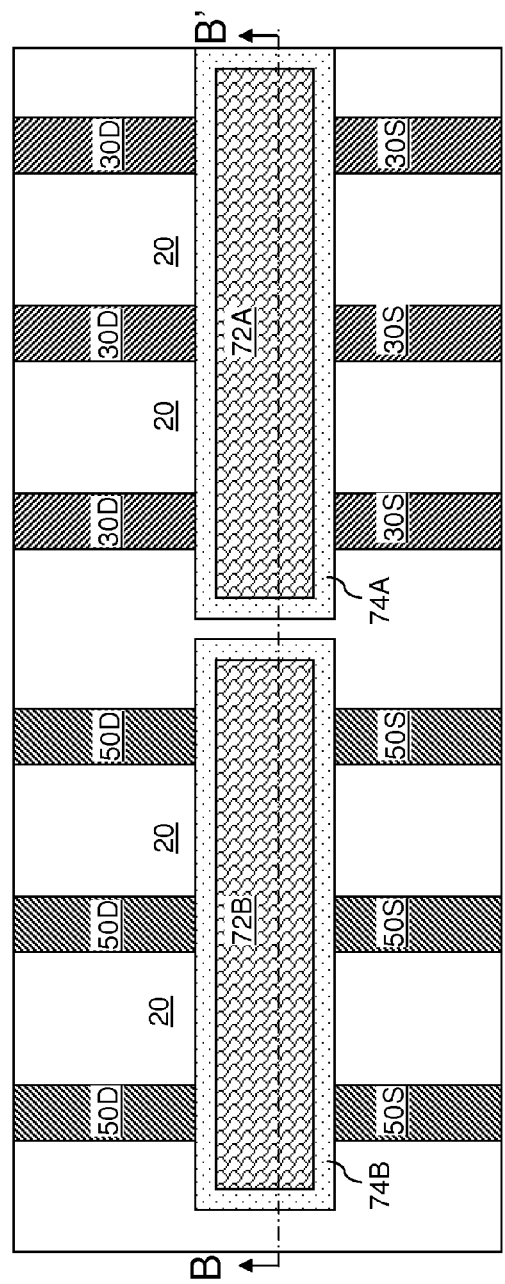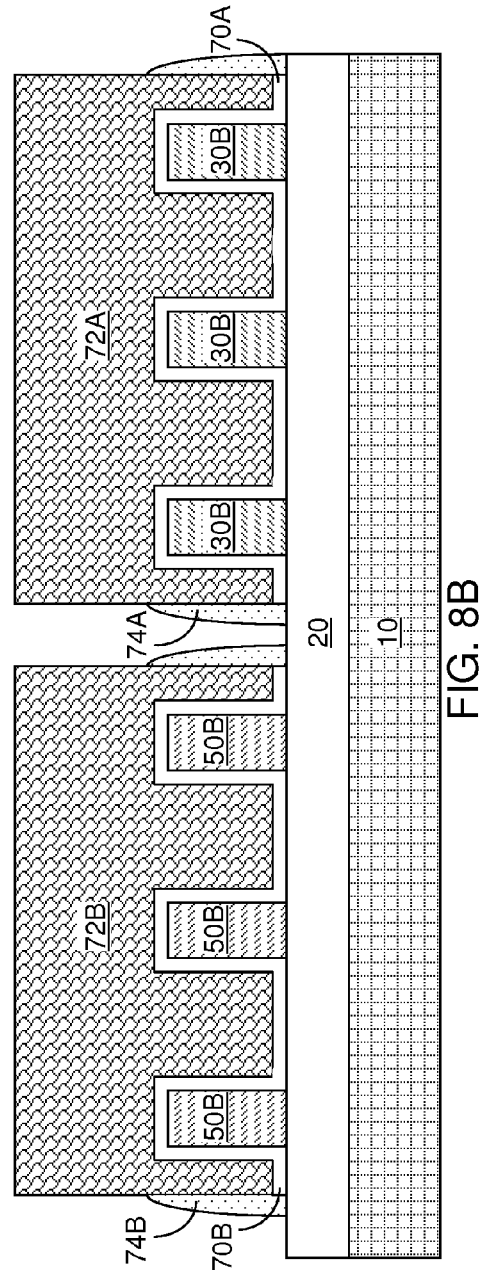
FIG. 8A
FIG. 8B

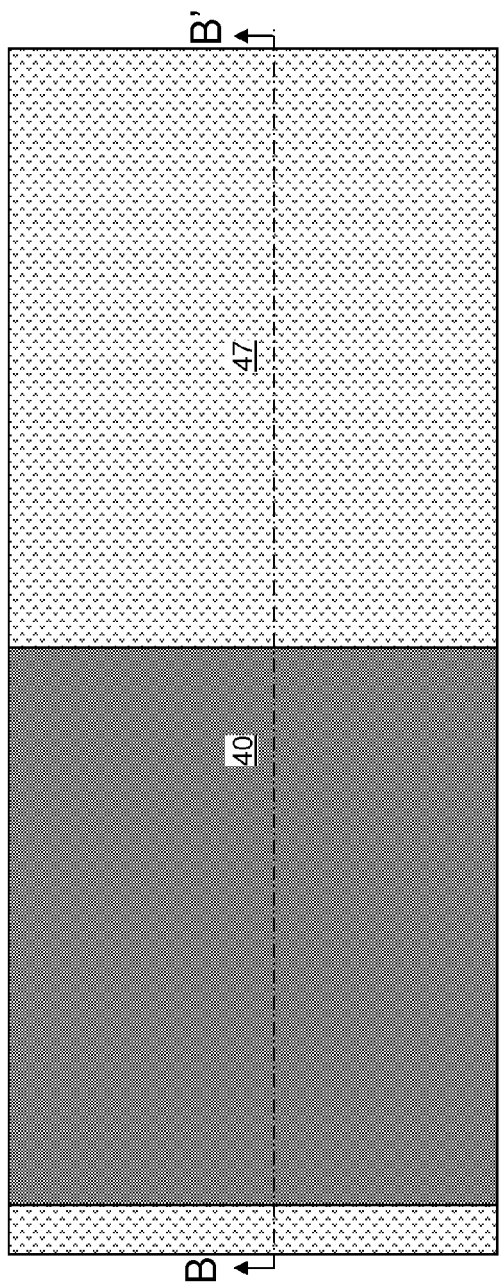
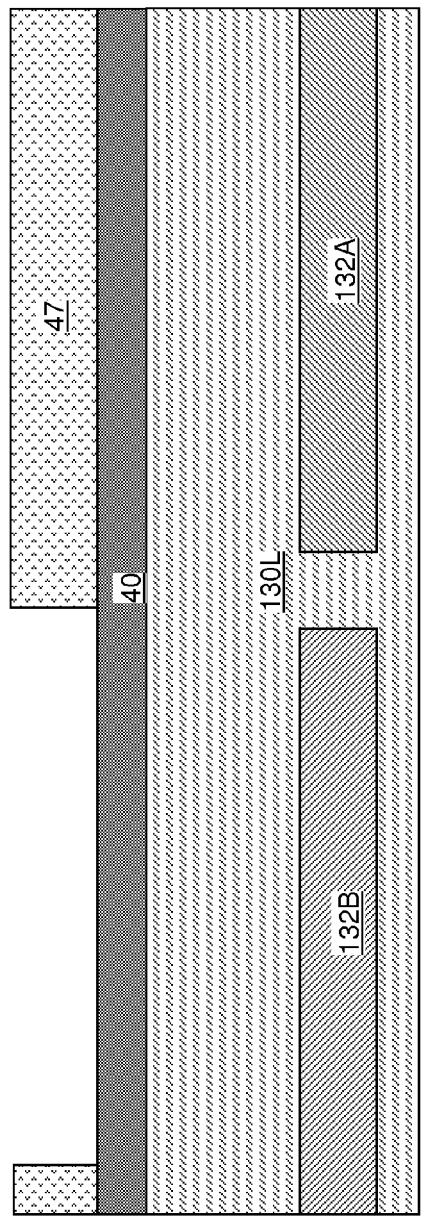

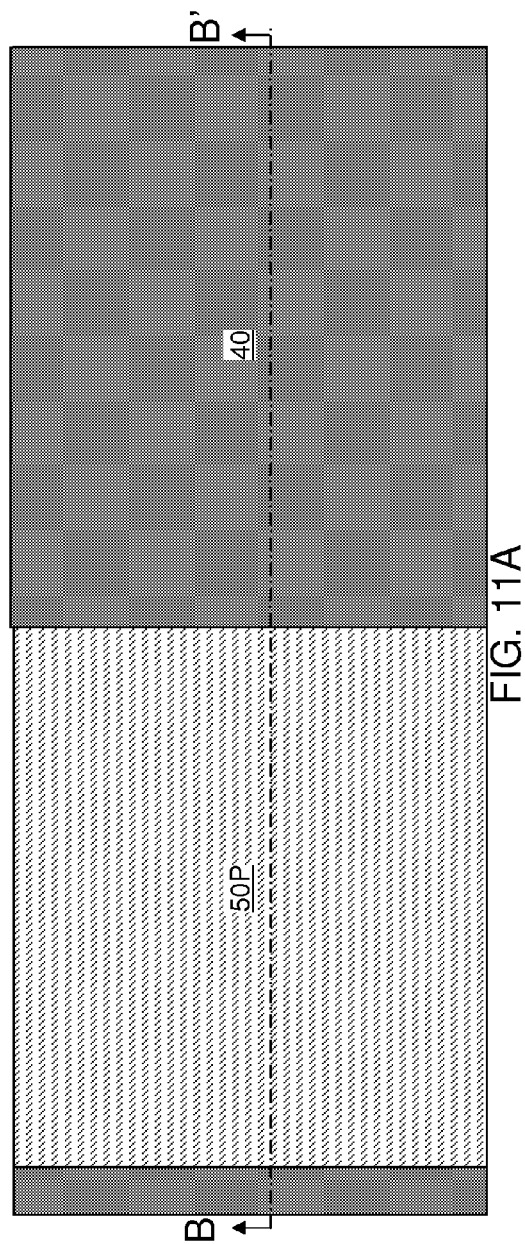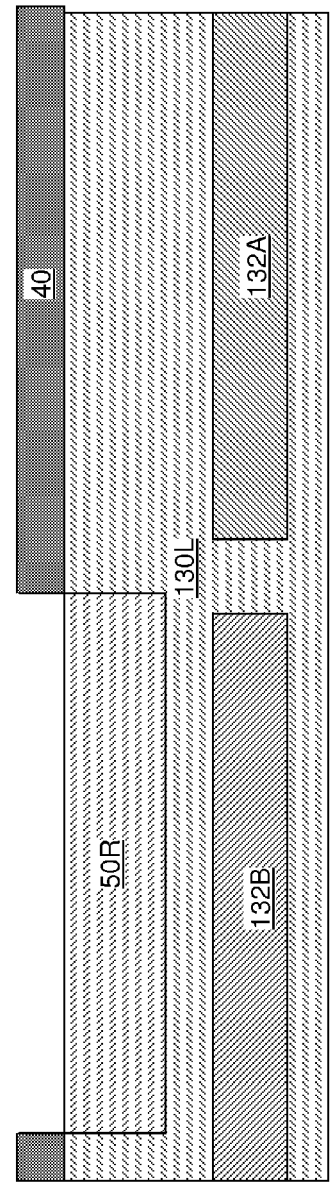

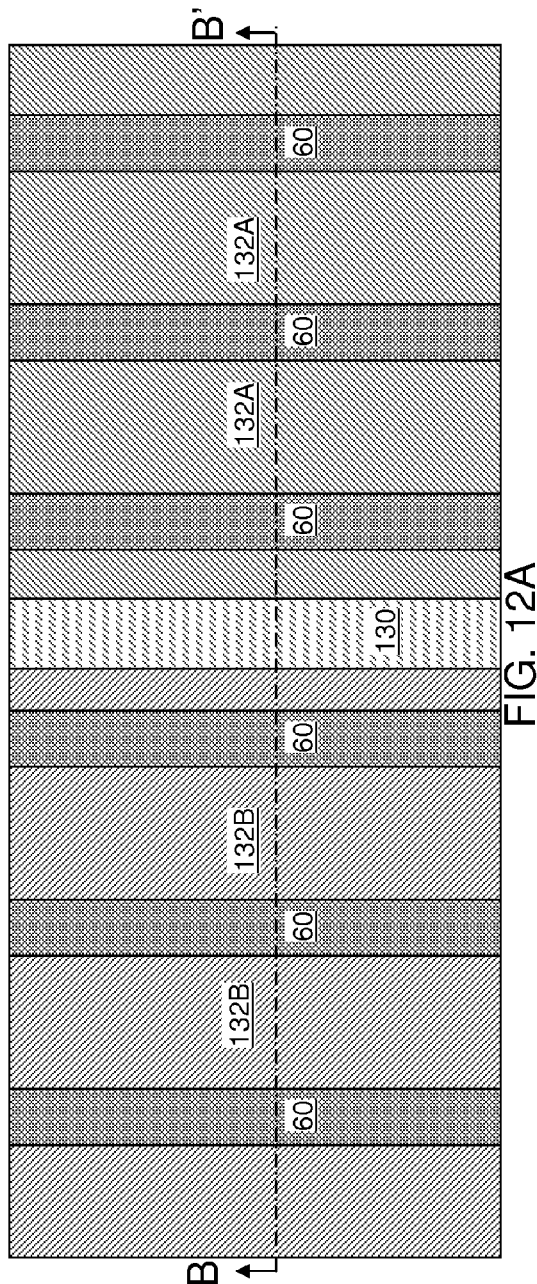
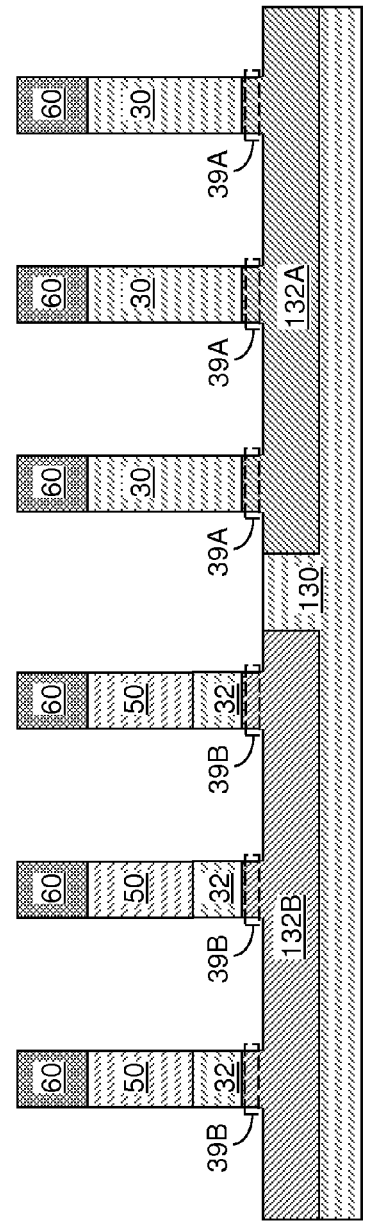
FIG. 12A
FIG. 12B

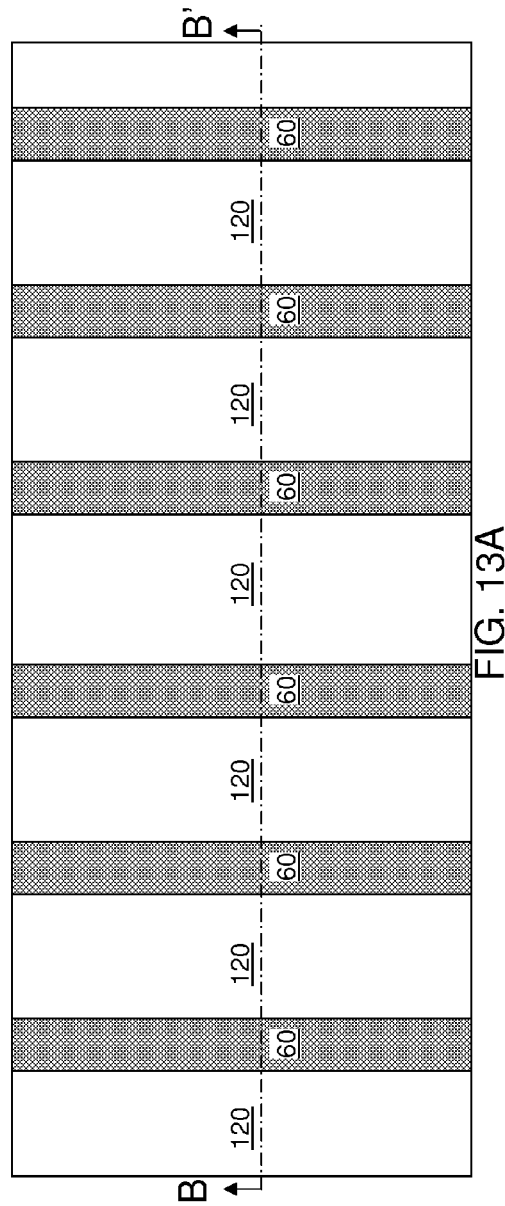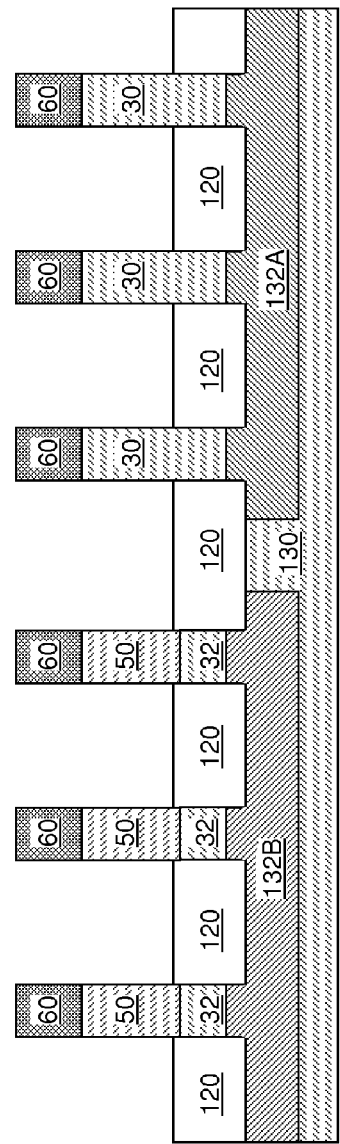
FIG. 13A
FIG. 13B

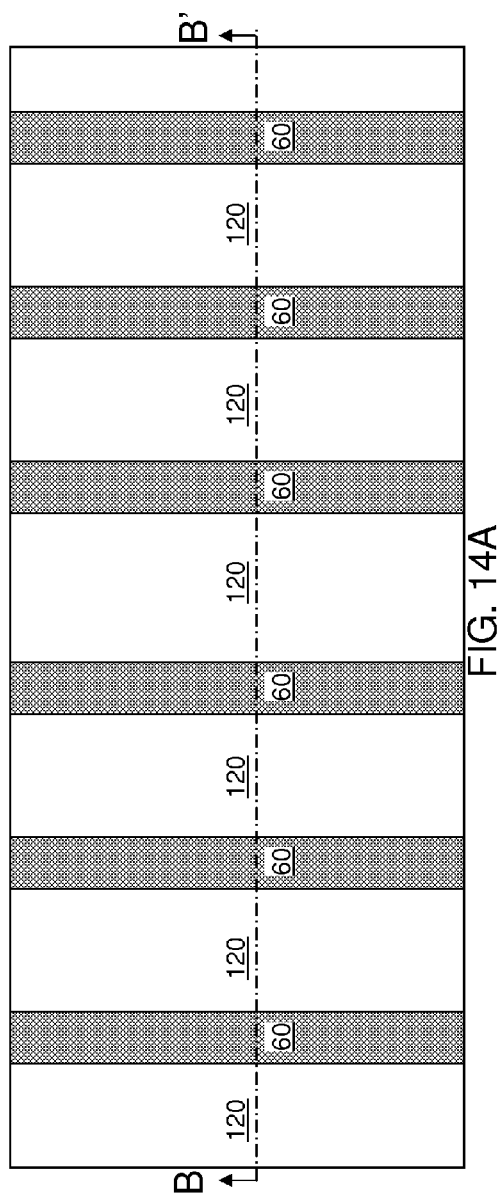
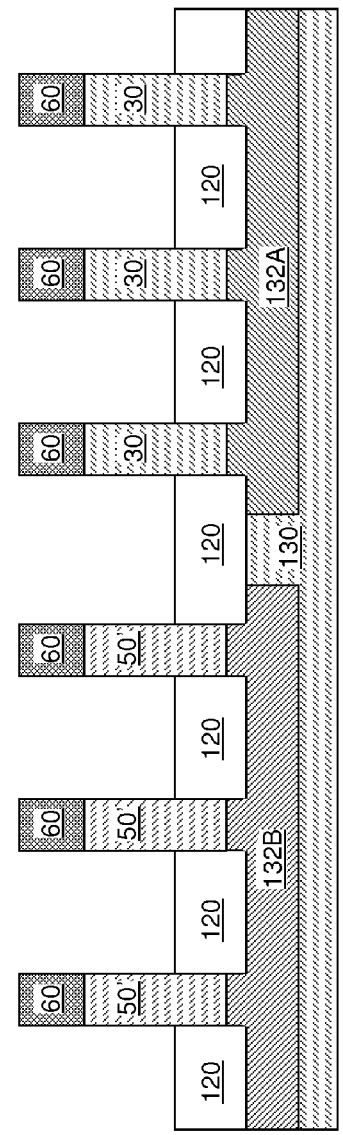
FIG. 14A
FIG. 14B

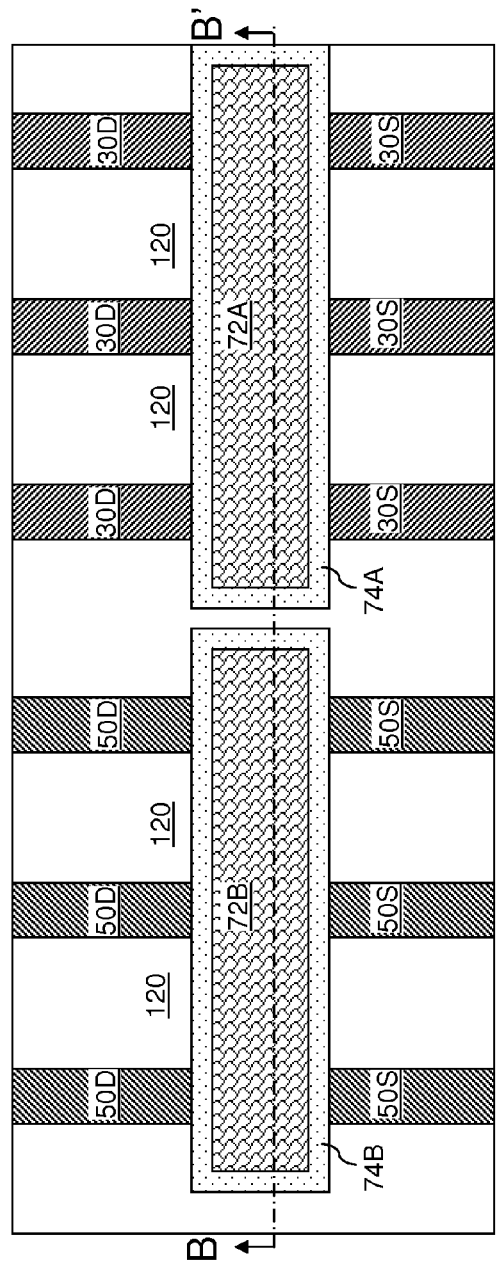
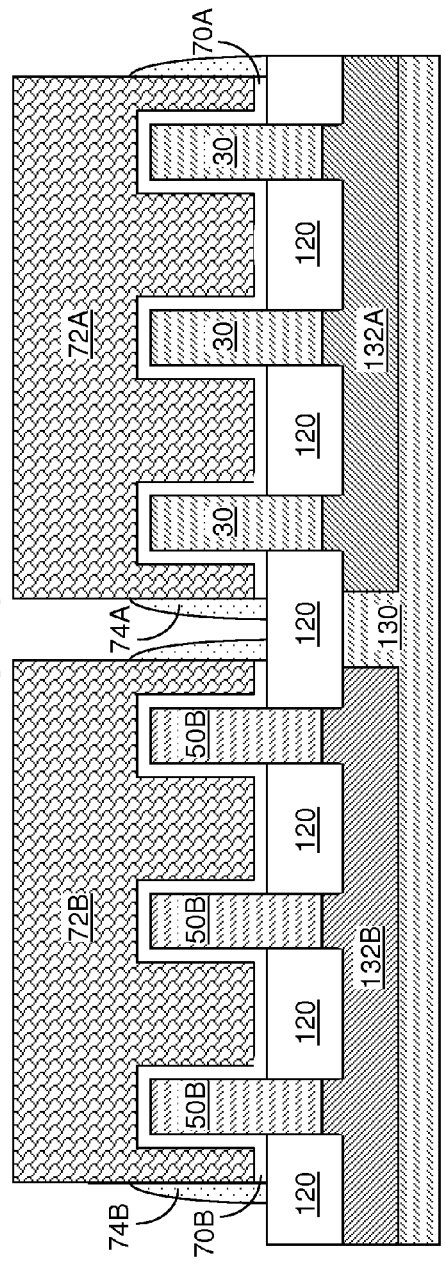
FIG. 15A
FIG. 15B

SEMICONDUCTOR ALLOY FIN FIELD EFFECT TRANSISTOR

BACKGROUND

The present disclosure relates to a semiconductor structure, and more particularly to a semiconductor structure including semiconductor fins containing an alloy of two semiconductor materials, and a method of manufacturing the same.

A semiconductor alloy material including at least two semiconductor materials can provide a performance advantage for a field effect transistor. For example, a silicon germanium alloy channel can provide enhanced on-current over a silicon channel for p-type field effect transistors. However, forming a semiconductor alloy material on a semiconductor substrate is prone to generating an undesirable lateral diffusion of semiconductor materials into neighboring semiconductor material regions requiring a single semiconductor material.

BRIEF SUMMARY

Semiconductor alloy fin structures can be formed by recessing a semiconductor material layer including a first semiconductor material to form a trench, and epitaxially depositing a semiconductor alloy material of the first semiconductor material and a second semiconductor material within the trench. The semiconductor alloy material is epitaxially aligned to the first semiconductor material in the semiconductor material layer. First semiconductor fins including the first semiconductor material and second semiconductor fins including the semiconductor alloy material can be simultaneously formed. In one embodiment, the first and second semiconductor fins can be formed on an insulator layer, which prevents diffusion of the second semiconductor material to the first semiconductor fins. In another embodiment, shallow trench isolation structures and reverse biased wells can be employed to provide electrical insulation among neighboring semiconductor fins.

According to an aspect of the present disclosure, a method of forming a semiconductor structure is provided. A trench is formed in a single crystalline semiconductor material layer including a first semiconductor material and located in a semiconductor substrate. A single crystalline semiconductor alloy of the first semiconductor material and a second semiconductor material different from the first semiconductor material is epitaxially deposited within the trench. The single crystalline semiconductor material layer and the single crystalline semiconductor alloy are patterned to form a first semiconductor fin including the first semiconductor material and a second semiconductor fin including the single crystalline semiconductor alloy, respectively.

According to another aspect of the present disclosure, a semiconductor structure is provided, which includes a semiconductor substrate embedding a first single crystalline embedded doped well and a second single crystalline embedded doped well in an upper portion of the semiconductor substrate. A first semiconductor fin is epitaxially aligned to the first single crystalline embedded doped well and includes a first single crystalline semiconductor material. A second semiconductor fin is epitaxially aligned to the second single crystalline embedded doped well, and includes a single crystalline semiconductor alloy of the first semiconductor material and a second semiconductor material different from the first semiconductor material, and is located on the top surface of the insulator layer.

According to yet another aspect of the present disclosure, another semiconductor structure is provided which includes a substrate that contains a stack, from bottom to top, of a handle substrate and an insulator layer. A first semiconductor fin includes a first single crystalline semiconductor material and is located on a top surface of the insulator layer. A second semiconductor fin includes a single crystalline semiconductor alloy of the first semiconductor material and a second semiconductor material different from the first semiconductor material, and is located over the top surface of the insulator layer. The first single crystalline semiconductor material and the single crystalline semiconductor alloy material have an identically oriented set of crystallographic orientations.

BRIEF DESCRIPTION OF SEVERAL VIEWS OF THE DRAWINGS

FIG. 1A is a top-down view of a first exemplary semiconductor structure after formation of a hard mask layer and application and patterning of a photoresist layer according to a first embodiment of the present disclosure.

FIG. 1B is a vertical cross-sectional view of the first exemplary semiconductor structure along the vertical plane B-B' of FIG. 1A.

FIG. 3A is a top-down view of the first exemplary semiconductor structure after epitaxially depositing a single crystalline semiconductor alloy region to the first embodiment of the present disclosure.

FIG. 3B is a vertical cross-sectional view of the first exemplary semiconductor structure along the vertical plane B-B' of FIG. 3A.

FIG. 4A is a top-down view of the first exemplary semiconductor structure after removal of the hard mask layer according to the first embodiment of the present disclosure.

FIG. 4B is a vertical cross-sectional view of the first exemplary semiconductor structure along the vertical plane B-B' of FIG. 4A.

FIG. 7A is a top-down view of the first exemplary semiconductor structure after optional homogenization of second semiconductor fins according to the first embodiment of the present disclosure.

FIG. 7B is a vertical cross-sectional view of the first exemplary semiconductor structure along the vertical plane B-B' of FIG. 7A.

FIG. 8A is a top-down view of the first exemplary semiconductor structure after formation of gate electrodes and source and drain regions according to the first embodiment of the present disclosure.

FIG. 8B is a vertical cross-sectional view of the first exemplary semiconductor structure along the vertical plane B-B' of FIG. 8A.

FIG. 10A is a top-down view of the second exemplary semiconductor structure after formation of a hard mask layer and application and patterning of a photoresist layer according to the second embodiment of the present disclosure.

FIG. 10B is a vertical cross-sectional view of the second exemplary semiconductor structure along the vertical plane B-B' of FIG. 10A.

FIG. 11A is a top-down view of the second exemplary semiconductor structure after epitaxially depositing a single crystalline semiconductor alloy region according to the second embodiment of the present disclosure.

FIG. 11B is a vertical cross-sectional view of the second exemplary semiconductor structure along the vertical plane B-B' of FIG. 11A.

FIG. 12A is a top-down view of the second exemplary semiconductor structure after patterning of first semiconductor fins and second semiconductor fins according to the second embodiment of the present disclosure.

FIG. 12B is a vertical cross-sectional view of the second exemplary semiconductor structure along the vertical plane B-B' of FIG. 12A.

FIG. 13A is a top-down view of the second exemplary semiconductor structure after formation of shallow trench isolation structures according to the second embodiment of the present disclosure.

FIG. 13B is a vertical cross-sectional view of the second exemplary semiconductor structure along the vertical plane B-B' of FIG. 13A.

FIG. 14A is a top-down view of the exemplary semiconductor structure after optional diffusion of materials within second semiconductor fins according to the second embodiment of the present disclosure.

FIG. 14B is a vertical cross-sectional view of the second exemplary semiconductor structure along the vertical plane B-B' of FIG. 14A.

FIG. 15A is a top-down view of the second exemplary semiconductor structure after formation of gate electrodes and source and drain regions according to the second embodiment of the present disclosure.

FIG. 15B is a vertical cross-sectional view of the second exemplary semiconductor structure along the vertical plane B-B' of FIG. 15A.

DETAILED DESCRIPTION

Figure 2A:
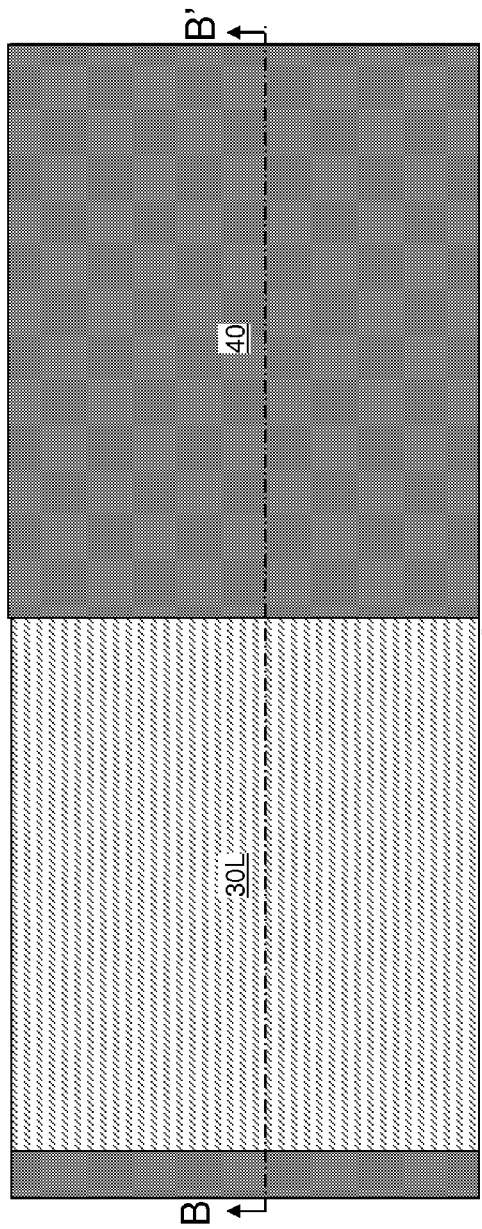
FIG. 2A is a top-down view of the first exemplary semiconductor structure after formation of a trench according to the first embodiment of the present disclosure.

As stated above, the present disclosure relates to a semiconductor structure including semiconductor fins containing an alloy of two semiconductor materials, and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A and 1B, a first exemplary semiconductor structure according to a first embodiment of the present disclosure can be formed by providing a semiconductor-on-insulator (SOI) substrate. The SOI substrate can include a vertical stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a single crystalline semiconductor material layer including a first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may, or may not, be doped with p-type dopants and/or n-type dopants. The entirety of the top semiconductor layer 30L can be single crystalline. In one embodiment, the first semiconductor material can be an elemental single crystalline semiconductor material. In one embodiment, the first semiconductor material can be single crystalline silicon. The thickness of the top semiconductor layer 30L can be from 10 nm to 500 nm, although lesser and greater thicknesses can also be employed.

A hard mask layer 40 can be formed over the top semiconductor layer 32L. The hard mask layer 40 includes a dielectric material such as silicon oxide, silicon nitride, silicon oxynitride, or a combination thereof. The hard mask layer 40 can be deposited, for example, by chemical vapor deposition (CVD). The hard mask layer 40 can be deposited as a blanket (unpatterned) layer having a uniform thickness over the top surface of the top semiconductor layer 30L. The thickness of the hard mask layer 40 can be from 3 nm to 100 nm, although lesser and greater thicknesses can also be employed.

A photoresist layer 47 is applied over the top semiconductor layer 30L, and is subsequently patterned by lithographic methods. Specifically, an opening is formed in the photoresist layer 47 above a region of the top semiconductor layer 30L by lithographic exposure and development.

Figure 2B:
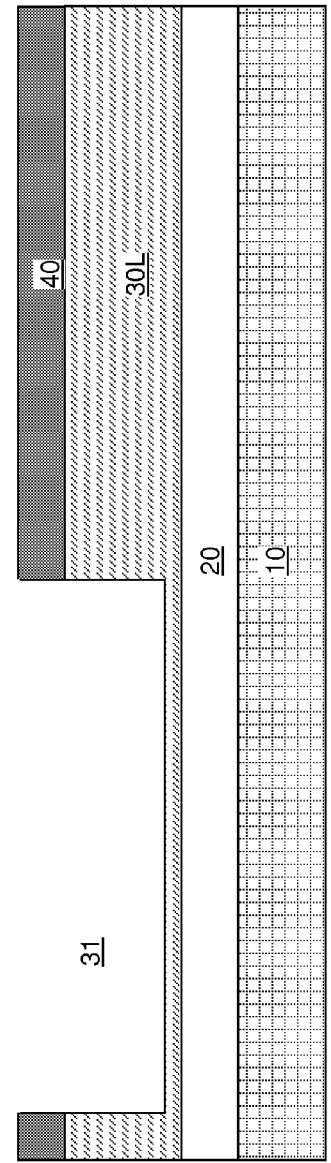
FIG. 2B is a vertical cross-sectional view of the first exemplary semiconductor structure along the vertical plane B-B' of FIG. 2A.

Referring to FIGS. 2A and 2B, the pattern in the photoresist layer 47 is transferred into an upper portion of the top semiconductor layer 30L by an etch that employs the photoresist layer 47 as an etch mask. The etch can be an anisotropic etch such as a reactive ion etch, or an isotropic etch such as a wet etch.

The portion of the top semiconductor layer 30L underneath the opening in the photoresist layer 47 is recessed during the etch. A trench 31 is formed in an upper portion of the top semiconductor layer 30L. The depth of the trench 31, defined as the vertical distance between the topmost surface of the top semiconductor layer 30L and the bottom surface of the trench 32, is less than the thickness of the top semiconductor layer 30L in regions outside the trench 31. Thus, the bottom surface of the trench 31 is located within a horizontal plane that is located above, and vertically spaced from, the interface between the top semiconductor layer 30L and the buried insulator layer 20. The ratio of the depth of the trench 31 to the thickness of the top semiconductor layer 30L in regions outside the trench 31 can be from 0.01 to 0.99, and is typically from 0.1 to 0.9. The photoresist layer 47 is subsequently removed selective to the top semiconductor layer 30L, for example, by ashing.

Referring to FIGS. 3A and 3B, an alloy of the first semiconductor material and a second semiconductor material is deposited within the trench 31 by selective epitaxy. The second semiconductor material is a different semiconductor material than the first semiconductor material. As used herein, a second semiconductor material is different from a first semiconductor material if the second semiconductor material includes a different elemental semiconductor material or a different compound semiconductor than the first semiconductor material. In one embodiment, the first semiconductor material can be silicon, and the second semiconductor material can be germanium or carbon.

The alloy of the first semiconductor material and the second semiconductor material can be deposited by selective epitaxy, in which the second epitaxial material nucleates upon, and grows from, physically exposed semiconductor surfaces of the first semiconductor material within the trench 31, while not nucleating on any dielectric surface such as the surfaces of the hard mask layer 40. The selective epitaxy can be performed, for example, by concurrently or alternately flowing reactant gases with an etchant gas. The reactant gases can be selected, for example, from a combination of at least two of $SiH_4$, $SiH_2Cl_2$, $SiHCl_3$, $SiCl_4$, $Si_2H_6$, $GeH_4$, $Ge_2H_6$, $CH_4$, $C_2H_2$, $C_2H_4$, $C_2H_6$, or any other source gas for silicon, germanium, carbon, or compound semiconductor materials as known in the art. The etchant gas can be, for example, HCl. A carrier gas such as $H_2$, He, Ar, $N_2$, or combinations thereof, can be optionally employed.

The alloy of the first semiconductor material and the second semiconductor material is deposited with epitaxial alignment to the single crystalline semiconductor structure of the top semiconductor layer 30L, and forms a single crystalline semiconductor alloy region 50R. In one embodiment, the alloy of the first semiconductor material and the second semiconductor material can be deposited to completely fill the trench 31 and to protrude above the horizontal plane of the top surface of the hard mask layer 40. Subsequently, the portion of the alloy of the first semiconductor material and the second semiconductor material above the horizontal plane of the top surface of the hard mask layer 40 can be removed, for example, by chemical mechanical planarization. Optionally, the alloy of the first semiconductor material and the second semiconductor material can be recessed below the horizontal plane of the top surface of the hard mask layer 40 by a wet etch or a dry etch such that the recessed top surface of the single crystalline semiconductor alloy region 50R is located below the horizontal plane of the top surface of the hard mask layer 40.

In one embodiment, the top surface of the single crystalline semiconductor alloy region 50R can be substantially coplanar with, raised above, or recessed below the topmost surface of the top semiconductor layer 30L. A horizontal interface between the first semiconductor material of the top semiconductor layer 30L and the single crystalline semiconductor alloy region 50R is formed above the interface between the buried insulator layer 20 and the top semiconductor layer 30L. The single crystalline semiconductor alloy region 50R can include a single crystalline semiconductor alloy of at least two semiconductor materials.

In one embodiment, the first semiconductor material and the single crystalline semiconductor alloy material in the single crystalline semiconductor alloy region 50R can be single crystalline semiconductor materials having a same crystallographic structure. In this case, the first single crystalline semiconductor material of the top semiconductor layer 30L and the single crystalline semiconductor alloy material of the single crystalline semiconductor alloy region 50R can have an identically oriented set of crystallographic orientations. In other words, each corresponding crystallographic orientation having a same set of Miller indices can be spatially along the same orientation across the top semiconductor layer 30L and the single crystalline semiconductor alloy region 50R.

Referring to FIGS. 4A and 4B, the hard mask layer 40 is removed, for example, by a wet etch. In one embodiment, the removal of the hard mask layer 40 can be performed employing an etch chemistry that is selective to the semiconductor materials of the top semiconductor layer 30L and the single crystalline semiconductor alloy region 50R. Optionally, a planarization process, such as chemical mechanical planarization, can be performed so that the topmost surface of the top semiconductor layer 30L and the top surface of the single crystalline semiconductor alloy region 50R are coplanar with each other.

Figure 5A:
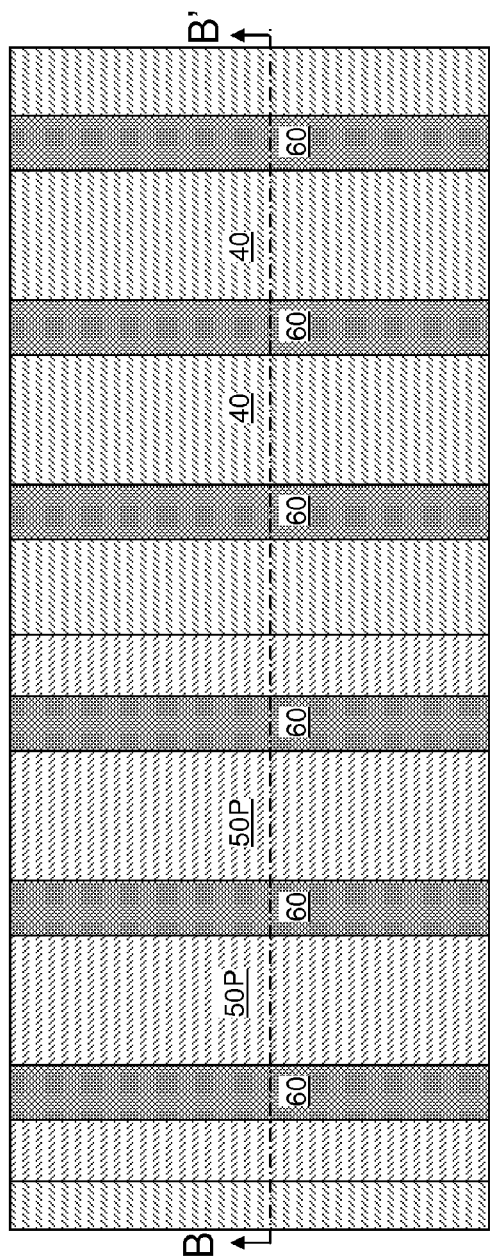
FIG. 5A is a top-down view of the first exemplary semiconductor structure after formation of fin cap dielectric portions according to the first embodiment of the present disclosure.
Figure 5B:
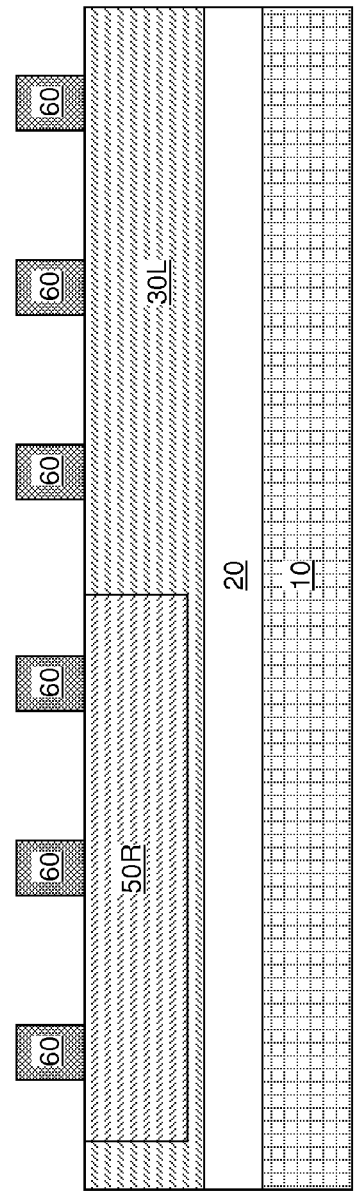
FIG. 5B is a vertical cross-sectional view of the first exemplary semiconductor structure along the vertical plane B-B' of FIG. 5A.

Referring to FIGS. 5A and 5B, a plurality of fin cap dielectric portions 60 are formed over the top semiconductor layer 30L and the single crystalline semiconductor alloy region 50R. The plurality of fin cap dielectric portions 60 can be formed, for example, by forming a dielectric material layer on top of the top semiconductor layer 30L and the single crystalline semiconductor alloy region 50R, and subsequently patterning the dielectric material layer with a pattern by a lithographic method. For example, a photoresist layer (not shown) can be applied over the dielectric material layer and lithographically patterned, and the pattern in the photoresist layer can be transferred into the dielectric material layer by a pattern transfer etch to form the plurality of fin cap dielectric portions 60. The photoresist layer can be removed, for example, by ashing.

The dielectric material layer includes a dielectric material such as silicon oxide, silicon nitride, silicon oxynitride, a dielectric metal oxide, or a dielectric metal oxynitride. The dielectric material layer can be deposited, for example, by chemical vapor deposition (CVD), atomic layer deposition (ALD), or by spin-coating. The thickness of the dielectric material layer can be, for example, from 10 nm to 200 nm, although lesser and greater thicknesses can also be employed.

In one embodiment, the pattern in the plurality of fin cap dielectric portions 60 can include a plurality of line structures having a uniform width and laterally extending along a direction, which is herein referred to as a lengthwise direction of the plurality of fin cap dielectric portions 60. In one embodiment, the uniform width can be a minimum lithographic dimension that can be printed as parallel lines. For example, the uniform width can be 80 nm or less. In one embodiment, portions of the plurality of fin cap dielectric portions 60 can be in a one-dimensional array having a periodicity along a horizontal direction that is perpendicular to the lengthwise direction of the plurality of fin cap dielectric portions 60.

Figure 6A:
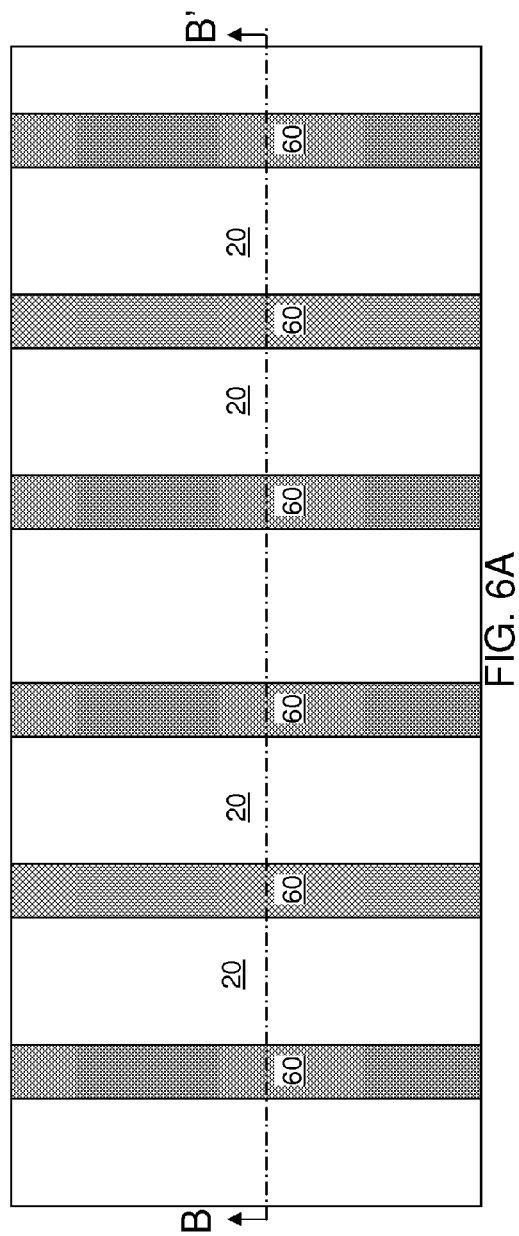
FIG. 6A is a top-down view of the first exemplary semiconductor structure after patterning of first semiconductor fins and second semiconductor fins according to the first embodiment of the present disclosure.
Figure 6B:
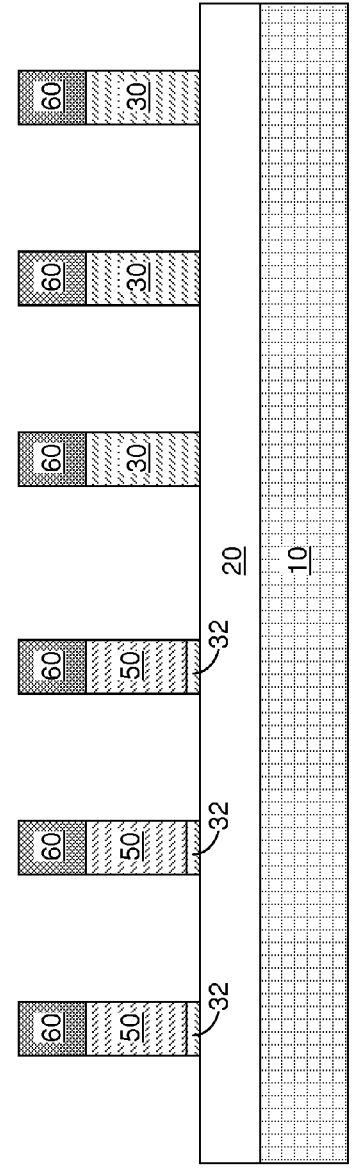
FIG. 6B is a vertical cross-sectional view of the first exemplary semiconductor structure along the vertical plane B-B' of FIG. 6A.

Referring to FIGS. 6A and 6B, the pattern in the plurality of fin cap dielectric portions 60 is transferred into the top semiconductor layer 30L and the single crystalline semiconductor alloy region 50R by an etch, which can be an anisotropic etch such as a reactive ion etch. The etch removes the semiconductor materials of the top semiconductor layer 30L and the single crystalline semiconductor alloy region 50R employing the plurality of fin cap dielectric portions 60 as an etch mask. The etch can proceed until the top surface of the buried insulator layer 20 is physically exposed.

First vertical stacks including remaining portions of the top semiconductor layer 30L and a first subset of the plurality of fin cap dielectric portions 60 are formed in regions that do not include the single crystalline semiconductor alloy material (i.e., in regions in which the single crystalline semiconductor alloy region 50R is not present at the processing step of FIGS. 5A and 5B), and second vertical stacks including remaining portions of the single crystalline semiconductor alloy region 50R and the top semiconductor layer 30L and a second subset of the plurality of fin cap dielectric portions 60 are formed in regions that include the single crystalline semiconductor alloy material (i.e., in regions in which the single crystalline semiconductor alloy region 50R is present at the processing step of FIGS. 5A and 5B). Each first vertical stack includes a first semiconductor fin 30 and a fin cap dielectric portion 60. Each second vertical stack includes a second semiconductor fin and a fin cap dielectric portion 60. Each second semiconductor fin includes a vertical stack of a first semiconductor material portion 32 including the first semiconductor material and a semiconductor alloy portion 50 including the second semiconductor material. Each first semiconductor material portion 32 is a single crystalline portion of the first semiconductor material. Each semiconductor alloy portion 50 is a single crystalline semiconductor alloy material portion that is epitaxially aligned to the underlying single crystalline portion of the first semiconductor material, i.e., an underlying first semiconductor material portion 32.

The top surface of the buried insulator layer 20 is physically exposed by etching portions of the top semiconductor layer 30L, which is a single crystalline semiconductor material layer, and the single crystalline semiconductor alloy region 50R, which includes a single crystalline semiconductor alloy. Each first semiconductor fin 30 is single crystalline throughout the entirety thereof, and each second semiconductor fin (32, 50) is single crystalline throughout the entirety thereof. In one embodiment, each first semiconductor material portion 32 can include a single semiconductor material such as silicon, and each semiconductor alloy portion 50 can include a single crystalline semiconductor alloy of at least two semiconductor materials such as a silicon-germanium alloy or a silicon-carbon alloy. Each first semiconductor fin 30 includes the first single crystalline semiconductor material, and is located on the top surface of the buried insulator layer 20. Each semiconductor alloy portion 50 can include a single crystalline semiconductor alloy of the first semiconductor material and a second semiconductor material different from the first semiconductor material. Each semiconductor alloy portion 50 is located over the top surface of the buried insulator layer 20. The first single crystalline semiconductor material and the single crystalline semiconductor alloy material have an identically oriented set of crystallographic orientations.

Referring to FIGS. 7A and 7B, an optional homogenization of the second semiconductor fins (32, 50) can be performed. As used herein, "homogenization" is a process of reducing differences in compositions of different material portions or making a transition in composition from one material portion to another material portion more gradual than before. The optional homogenization of the composition within the second semiconductor fin (32, 50) can be performed by inducing interdiffusion of materials across the portion of the first semiconductor material and the portion of the single crystalline semiconductor alloy, i.e., across the first semiconductor material portion 32 and the semiconductor alloy portion 50 within the second semiconductor fins (32, 50). The interdiffusion of materials across the first semiconductor material portion 32 and the semiconductor alloy portion 50 within the second semiconductor fins (32, 50) can be performed, for example, by a thermal anneal at an elevated temperature, which can be, for example, in a range from 700° C. to 1,200° C., although lesser and greater temperatures can also be employed. If homogenization is performed, the second semiconductor fins (32, 50) are converted into homogenized second semiconductor fins 50', which does not have an atomic level interface between a first semiconductor portion 32 and a second semiconductor portion 50. The entirety of the homogenized second semiconductor fins 50' includes the second semiconductor material.

The homogenization of the second semiconductor fins (32, 50) may, or may not, be complete. If the homogenization of the second semiconductor fins (32, 50) is complete, an atomic concentration of an elemental semiconductor or a compound semiconductor material that is present in the single crystalline semiconductor alloy and not present in the first single crystalline semiconductor material is constant throughout the entirety of each homogenized second semiconductor fin 50'. If the homogenization of the second semiconductor fins (32, 50) is incomplete, an atomic concentration of an elemental semiconductor or a compound semiconductor material that is present in the single crystalline semiconductor alloy and not present in the first single crystalline semiconductor material increases with a vertical distance from the buried insulator layer at least within a bottom portion of each homogenized second semiconductor fin 50'. In one embodiment, the atomic concentration of an elemental semiconductor or a compound semiconductor material that is present in the single crystalline semiconductor alloy and not present in the first single crystalline semiconductor material can increase with a vertical distance from the buried insulator layer at least throughout the entirety of each homogenized second semiconductor fin 50'. In another embodiment, the atomic concentration of an elemental semiconductor or a compound semiconductor material that is present in the single crystalline semiconductor alloy and not present in the first single crystalline semiconductor material can be substantially uniform in an upper portion of said second semiconductor fin.

In one embodiment, the first single crystalline semiconductor material can be single crystalline silicon, and an elemental semiconductor or a compound semiconductor material that is present in the single crystalline semiconductor alloy and not present in the first single crystalline semiconductor material can be germanium, carbon, gallium arsenide, or another compound semiconductor material.

Referring to FIGS. 8A and 8B, a stack of a first gate dielectric 70A and a first gate electrode 72A can be formed over one or more of the first semiconductor fins. A first gate spacer 74A can be formed around the stack of the first gate dielectric 70A and the first gate electrode 72A. Source and drain ion implantation can be performed, optionally after masking the homogenized second semiconductor fins 50' (See FIGS. 7A and 7B) or the second semiconductor fins (32, 50) without homogenization (See FIGS. 6A and 6B), to form first source regions 30S and first drain regions 30D. Portions of the first semiconductor fins 30 that are not converted into the first source regions 30S or the first drain regions 30D are first body regions 30B, which include channels of a first field effect transistor.

A stack of a second gate dielectric 70B and a second gate electrode 72B can be formed over one or more of the homogenized second semiconductor fins 50' (See FIGS. 7A and 7B) or the second semiconductor fins (32, 50) without homogenization (See FIGS. 6A and 6B). A second gate spacer 74B can be formed around the stack of the second gate dielectric 70B and the second gate electrode 72B. Source and drain ion implantation can be performed, optionally after masking the first semiconductor fins 30 (See FIGS. 7A and 7B), to form second source regions 50S and second drain regions 50D. Portions of the homogenized second semiconductor fins 50' (or second semiconductor fins (32, 50) that are not homogenized) that are not converted into the second source regions 50S or the second drain regions 50D are second body regions 50B, which include channels of a second field effect transistor.

The different semiconductor materials in the first and second field effect transistors can be employed to optimize the performance of the first and second field effect transistors independently. In one embodiment, one of the first and second field effect transistors is a p-type field effect transistor, and the other of the first and second field effect transistors is an n-type field effect transistor. In this case, the use of two different semiconductor materials in the channels of the first and second field effect transistors enable separate optimization of the p-type field effect transistor and the n-type field effect transistor, for example, for the purpose of maximizing the on-current.

Figure 9A:
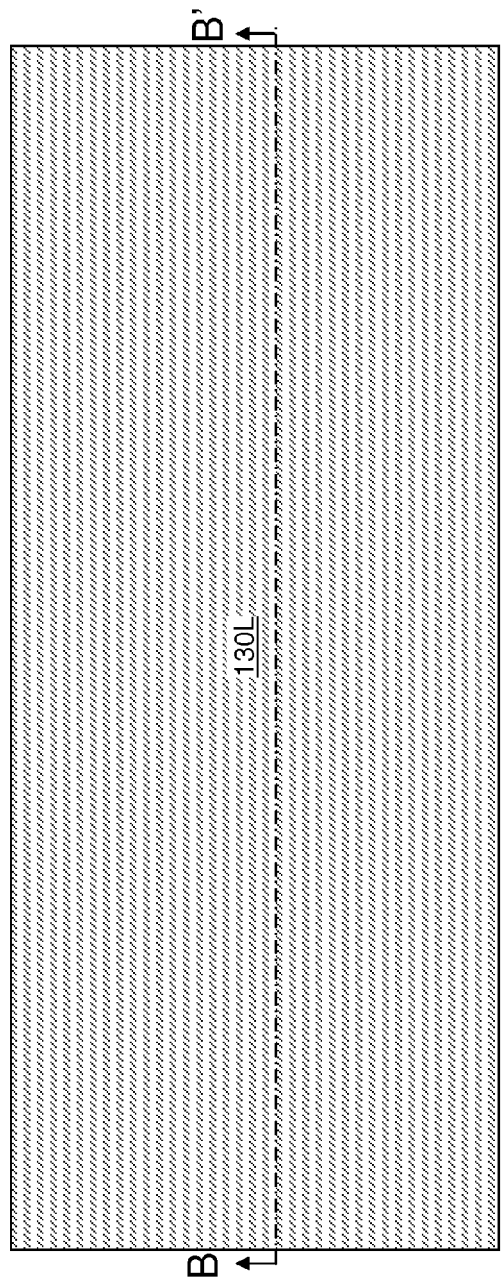
FIG. 9A is a top-down view of a second exemplary semiconductor structure after formation of single crystalline embedded doped wells according to a second embodiment of the present disclosure.
Figure 9B:
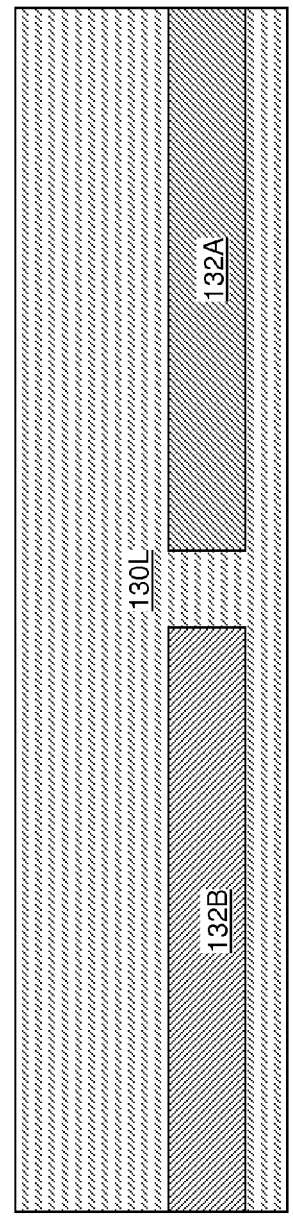
FIG. 9B is a vertical cross-sectional view of the second exemplary semiconductor structure along the vertical plane B-B' of FIG. 9A.

Referring to FIGS. 9A and 9B, a second exemplary semiconductor structure according to a second embodiment of the present disclosure can be formed employing a bulk semiconductor substrate including a single crystalline semiconductor layer 130L. The single crystalline semiconductor layer 130L includes a first semiconductor material throughout an entirety thereof. The entirety of the single crystalline semiconductor layer 130L is single crystalline.

A first embedded doped well 132A and a second embedded doped well 132B can be formed within the single crystalline semiconductor layer 130L. In one embodiment, the first embedded doped well 132A and the second embedded doped well 132B may have a doping of opposite conductivity types. For example, the first embedded doped well 132A can be a p-doped well and the second embedded doped well 132B can be an n-doped well, or vice versa. The dopant concentration of the first embedded doped well 132A and the second embedded doped well 132B can be in any range known in the art for well doping. The topmost surface of the first embedded doped well 132A and the topmost surface of the second embedded doped well 132B are vertically spaced from the topmost surface of the single crystalline semiconductor layer 130L by a vertical distance, which is approximately by a height of semiconductor fins to be subsequently formed. The vertical distance can be, for example, from 30 nm to 300 nm, although lesser and greater vertical distances can also be employed.

Referring to FIGS. 10A and 10B, a hard mask layer 40 and a photoresist layer 47 is formed in the same manner as in the first embodiment. The opening in the photoresist layer 47 can overlie the second embedded doped well 132B.

Referring to FIGS. 11A and 11B, a single crystalline semiconductor alloy region 50R is formed in the same manner as in the first embodiment. The single crystalline semiconductor alloy region 50R can overlie, and can be vertically spaced from, the second embedded doped well 132B.

Referring to FIGS. 12A and 12B, the processing steps of FIGS. 4A, 4B, 5A, 5B, 6A, and 6B are performed in the same manner as in the first embodiment except for the modification that the first embedded doped well 132A and the second embedded doped well 132B are employed as etch stop layers for the purpose of the anisotropic etch that defines semiconductor fins instead of the top surface of the buried insulator layer 20 of the first embodiment (See FIGS. 6A and 6B). In one embodiment, overetch may be optionally performed through the top surfaces of the first embedded doped well 132A and the second embedded doped well 132B.

First vertical stacks are formed above a horizontal surface of the first embedded doped well 132A. First vertical stacks include remaining portions of the top semiconductor layer 30L above the first embedded doped well 132A, a first subset of the plurality of fin cap dielectric portions 60 located above the first embedded doped well 132A, and optionally portions of the first embedded doped well 132A above a horizontal recessed surface of the first embedded doped well 132A, if the first embedded doped well 132A includes the horizontal recessed surface. Second vertical stacks are formed above a horizontal surface of the second embedded doped well 132B. Second vertical stacks include remaining portions of the single crystalline semiconductor alloy region 50R above the second embedded doped well 132B, remaining portions of the top semiconductor layer 30L above the second embedded doped well 132B, and a second subset of the plurality of fin cap dielectric portions 60 located above the second embedded doped well 132B, and optionally portions of the second embedded doped well 132B above a horizontal recessed surface of the second embedded doped well 132B, if the second embedded doped well 132B includes the horizontal recessed surface. Each first vertical stack includes a first semiconductor fin 30 and a fin cap dielectric portion 60 and optionally a portion of the first embedded doped well 132A, which is herein referred to as an upper first embedded doped well portion 39A. Each second vertical stack includes a second semiconductor fin and a fin cap dielectric portion 60 and optionally a portion of the second embedded doped well 132B, which is herein referred to as an upper second embedded doped well portion 39B. Each second semiconductor fin includes a vertical stack of a first semiconductor material portion 32 including the first semiconductor material and a semiconductor alloy portion 50 including the second semiconductor material. Each first semiconductor material portion 32 is a single crystalline portion of the first semiconductor material. Each semiconductor alloy portion 50 is a single crystalline semiconductor alloy portion that is epitaxially aligned to the underlying single crystalline portion of the first semiconductor material, i.e., an underlying first semiconductor material portion 32.

A horizontal surface of the first embedded doped well 132A and a horizontal surface of the second embedded doped well 132B are physically exposed by etching portions of the top semiconductor layer 30L, which is a single crystalline semiconductor material layer, and the single crystalline semiconductor alloy region 50R, which includes a single crystalline semiconductor alloy. Each first semiconductor fin 30 is single crystalline throughout the entirety thereof, and each second semiconductor fin (32, 50) is single crystalline throughout the entirety thereof. In one embodiment, each first semiconductor material portion 32 can include a single semiconductor material such as silicon, and each semiconductor alloy portion 50 can include a single crystalline semiconductor alloy of at least two semiconductor materials such as a silicon-germanium alloy or a silicon-carbon alloy. Each first semiconductor fin 30 includes the first single crystalline semiconductor material, and is located on the top surface of the buried insulator layer 20. Each semiconductor alloy portion 50 can include a single crystalline semiconductor alloy of the first semiconductor material and a second semiconductor material different from the first semiconductor material. Each semiconductor alloy portion 50 is located over the top surface of the buried insulator layer 20. The first single crystalline semiconductor material and the single crystalline semiconductor alloy material have an identically oriented set of crystallographic orientations.

Referring to FIGS. 13A and 13B, shallow trench isolation structures 120 can be formed on the first and second embedded doped wells (132A, 132B) and on lower portions of sidewalls of the first semiconductor fins 30 and the second semiconductor fins (32, 50). The shallow trench isolation structures 120 include a dielectric material such as silicon oxide, silicon oxynitride, silicon nitride, or organosilicate glass. The shallow trench isolation structures 120 can be formed, for example, by spin-coating of a dielectric material, or a combination of a deposition, a planarization, and a recess of a dielectric material. In on embodiment, the top surfaces of the shallow trench isolation structures 120 are located above the top surfaces of the first and second embedded doped wells (132A, 132B). The top surfaces of the shallow trench isolation structures 120 may be above, at, or below the plane of the interface between the horizontal plane of interfaces between the first semiconductor material portions 32 and the semiconductor alloy portions 50.

Referring to FIGS. 14A and 14B, an optional homogenization of the second semiconductor fins (32, 50) can be performed. The optional homogenization of the composition within the second semiconductor fin (32, 50) can be performed by inducing interdiffusion of materials across the portion of the first semiconductor material and the portion of the single crystalline semiconductor alloy, i.e., across the first semiconductor material portion 32 and the semiconductor alloy portion 50 within the second semiconductor fins (32, 50). The interdiffusion of materials across the first semiconductor material portion 32 and the semiconductor alloy portion 50 within the second semiconductor fins (32, 50) can be performed, for example, by a thermal anneal at an elevated temperature, which can be, for example, in a range from 700° C. to 1,000° C., although lesser and greater temperatures can also be employed provided that the outdiffusion of dopants from the first and second embedded doped wells (132A, 132B) into the first and second semiconductor fins (30, 32, 50) is maintained below a level that substantially changes the dopant concentration in the first and second semiconductor fins (30, 32, 50). If homogenization is performed, the second semiconductor fins (32, 50) are converted into homogenized second semiconductor fins 50', which does not have an atomic level interface between a first semiconductor portion 32 and a second semiconductor portion 50. The entirety of the homogenized second semiconductor fins 50' includes the second semiconductor material.

The homogenization of the second semiconductor fins (32, 50) may, or may not, be complete. If the homogenization of the second semiconductor fins (32, 50) is complete, an atomic concentration of an elemental semiconductor or a compound semiconductor material that is present in the single crystalline semiconductor alloy and not present in the first single crystalline semiconductor material is constant throughout the entirety of each homogenized second semiconductor fin 50'. If the homogenization of the second semiconductor fins (32, 50) is incomplete, an atomic concentration of an elemental semiconductor or a compound semiconductor material that is present in the single crystalline semiconductor alloy and not present in the first single crystalline semiconductor material increases with a vertical distance from the buried insulator layer at least within a bottom portion of each homogenized second semiconductor fin 50'. In one embodiment, the atomic concentration of an elemental semiconductor or a compound semiconductor material that is present in the single crystalline semiconductor alloy and not present in the first single crystalline semiconductor material can increase with a vertical distance from the buried insulator layer at least throughout the entirety of each homogenized second semiconductor fin 50'. In another embodiment, the atomic concentration of an elemental semiconductor or a compound semiconductor material that is present in the single crystalline semiconductor alloy and not present in the first single crystalline semiconductor material can be substantially uniform in an upper portion of said second semiconductor fin.

In one embodiment, the first single crystalline semiconductor material can be single crystalline silicon, and an elemental semiconductor or a compound semiconductor material that is present in the single crystalline semiconductor alloy and not present in the first single crystalline semiconductor material can be germanium, carbon, gallium arsenide, or another compound semiconductor material.

Referring to FIGS. 15A and 15B, a stack of a first gate dielectric 70A and a first gate electrode 72A can be formed over one or more of the first semiconductor fins. A first gate spacer 74A can be formed around the stack of the first gate dielectric 70A and the first gate electrode 72A. Source and drain ion implantation can be performed, optionally after masking the homogenized second semiconductor fins 50' (See FIGS. 14A and 14B) or the second semiconductor fins (32, 50) without homogenization (See FIGS. 13A and 13B), to form first source regions 30S and first drain regions 30D. Portions of the first semiconductor fins 30 that are not converted into the first source regions 30S or the first drain regions 30D are first body regions 30B, which include channels of a first field effect transistor.

A stack of a second gate dielectric 70B and a second gate electrode 72B can be formed over one or more of the homogenized second semiconductor fins 50' (See FIGS. 14A and 14B) or the second semiconductor fins (32, 50) without homogenization (See FIGS. 13A and 13B). A second gate spacer 74B can be formed around the stack of the second gate dielectric 70B and the second gate electrode 72B. Source and drain ion implantation can be performed, optionally after masking the first semiconductor fins 30 (See FIGS. 14A and 14B), to form second source regions 50S and second drain regions 50D. Portions of the homogenized second semiconductor fins 50' (or second semiconductor fins (32, 50) that are not homogenized) that are not converted into the second source regions 50S or the second drain regions 50D are second body regions 50B, which include channels of a second field effect transistor.

The different semiconductor materials in the first and second field effect transistors can be employed to optimize the performance of the first and second field effect transistors independently. In one embodiment, one of the first and second field effect transistors is a p-type field effect transistor, and the other of the first and second field effect transistors is an n-type field effect transistor. In this case, the use of two different semiconductor materials in the channels of the first and second field effect transistors enable separate optimization of the p-type field effect transistor and the n-type field effect transistor, for example, for the purpose of maximizing the on-current.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a trench in a single crystalline semiconductor material layer comprising a first semiconductor material and located in a semiconductor substrate, wherein surfaces of said trench consist of single crystalline sidewall surfaces of said first semiconductor material and a single crystalline bottom surface of said first semiconductor material;
    epitaxially depositing a single crystalline semiconductor alloy of said first semiconductor material and a second semiconductor material different from said first semiconductor material directly on said single crystalline sidewall surfaces and said single crystalline bottom surface of said trench, said single crystalline semiconductor alloy having a single crystalline crystallographic structure that is in epitaxial alignment with a single crystalline structure of said single crystalline semiconductor material layer; and
    patterning said single crystalline semiconductor material layer and said single crystalline semiconductor alloy to form a first semiconductor fin comprising said first semiconductor material and a second semiconductor fin comprising said single crystalline semiconductor alloy, respectively.

2. The method of claim 1, wherein said semiconductor substrate is a semiconductor-on-insulator (SOI) substrate, said single crystalline semiconductor material layer is provided above a top surface of a buried insulator layer, and said forming of said trench comprises recessing a surface of said single crystalline semiconductor material layer to a depth less than a thickness of said single crystalline semiconductor material layer.

3. The method of claim 2, wherein an interface between said first semiconductor material and said single crystalline semiconductor alloy is formed above an interface between said buried insulator layer and said single crystalline semiconductor material layer.

4. The method of claim 2, wherein said forming of said first semiconductor fin and second semiconductor fin comprises physically exposing a top surface of said buried insulator layer by etching portions of said single crystalline semiconductor material layer and said single crystalline semiconductor alloy.

5. The method of claim 1, wherein said semiconductor substrate is a bulk semiconductor substrate comprising said first semiconductor material throughout an entirety thereof, and said method further comprises forming at least one embedded doped well region within said semiconductor substrate, wherein said forming of said trench comprises recessing a surface of said single crystalline semiconductor material layer to a depth less than a depth of a topmost surface of said at least one embedded doped well region.

6. The method of claim 5, wherein an interface between said first semiconductor material and said single crystalline semiconductor alloy is formed above a horizontal plane of said topmost surface of said at least one embedded doped well region.

7. The method of claim 5, wherein said forming of said first semiconductor fin and second semiconductor fin comprises physically exposing portions of said at least one embedded doped well region by etching portions of said single crystalline semiconductor material layer and said single crystalline semiconductor alloy.

8. The method of claim 5, further comprising forming a shallow trench isolation structure comprising a dielectric material on said at least one embedded doped well region and sidewalls of said first and second semiconductor fins.

9. The method of claim 1, wherein said second semiconductor fin comprises vertical stack of a portion of said first semiconductor material and a portion of said single crystalline semiconductor alloy.

10. The method of claim 9, further comprising homogenizing a composition within said second semiconductor fin by inducing interdiffusion of materials across said portion of said first semiconductor material and said portion of said single crystalline semiconductor alloy.

11. The method of claim 1, further comprising forming a plurality of fin cap dielectric portions including a dielectric material on a topmost surface of said single crystalline semiconductor alloy and a topmost surface of said single crystalline semiconductor material layer.

12. The method of claim 11, wherein said patterning of said single crystalline semiconductor material layer and said single crystalline semiconductor alloy comprises anisotropically etching portions of said single crystalline semiconductor alloy and said single crystalline semiconductor material layer employing said plurality of fin cap dielectric portions as an etch mask.

13. The method of claim 11, wherein said plurality of fin cap dielectric portions is formed by:
    forming a dielectric material layer on said topmost surface of said single crystalline semiconductor alloy and on said topmost surface of said single crystalline semiconductor material layer; and
    patterning said dielectric material layer.

14. The method of claim 11, wherein said plurality of fin cap dielectric portions includes a plurality of line structures having a uniform width.

15. The method of claim 11, wherein said topmost surface of said single crystalline semiconductor alloy and said topmost surface of said single crystalline semiconductor material layer are within a same horizontal plane.

16. The method of claim 11, wherein said single crystalline semiconductor alloy is deposited employing a selective epitaxy process during which said single crystalline semiconductor alloy nucleates upon, and grows from, said single crystalline sidewall surfaces of said first semiconductor material and said single crystalline bottom surface of said first semiconductor material, while not nucleating on any dielectric surface.

17. The method of claim 1, further comprising planarizing a portion of said single crystalline semiconductor alloy to provide a top surface of said single crystalline semiconductor alloy that is coplanar with a top surface of said single crystalline semiconductor material layer.

18. The method of claim 1, wherein said first semiconductor fin and said second semiconductor fin have a same height, and said second semiconductor fin further comprises a portion of said first semiconductor material that underlies a portion of said single crystalline semiconductor alloy.

19. The method of claim 2, wherein bottommost surfaces of said first semiconductor fin and said second semiconductor fin are coplanar with a topmost surface of said buried insulator layer.

20. The method of claim 5, wherein bottom edges of sidewalls of said first semiconductor fin and said second semiconductor fin are recessed below said topmost surface of said at least one embedded doped well region.

* * * * *